(12) United States Patent
Yamada et al.

(10) Patent No.: US 9,234,754 B2
(45) Date of Patent: Jan. 12, 2016

(54) GEOMAGNETISM SENSING DEVICE

(75) Inventors: Yukimitsu Yamada, Niigata-ken (JP);
Kisei Hirobe, Niigata-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 813 days.

(21) Appl. No.: 13/314,100

(22) Filed: Dec. 7, 2011

(65) Prior Publication Data

US 2012/0078571 A1      Mar. 29, 2012

Related U.S. Application Data

(63) Continuation of application No. PCT/JP2010/066345, filed on Sep. 22, 2010.

(30) Foreign Application Priority Data

Sep. 26, 2009   (JP) .................................. 2009-221716

(51) Int. Cl.
| | | |
|---|---|---|
| *G01C 17/38* | (2006.01) | |
| *G01C 17/30* | (2006.01) | |
| *G01C 19/00* | (2013.01) | |
| *G01P 3/44* | (2006.01) | |
| *G01R 33/00* | (2006.01) | |
| *G01R 33/02* | (2006.01) | |

(Continued)

(52) U.S. Cl.
CPC ................ *G01C 17/30* (2013.01); *G01C 19/00* (2013.01); *G01P 3/44* (2013.01); *G01R 33/0035* (2013.01); *G01R 33/0206* (2013.01); *G01V 3/081* (2013.01); *G01V 3/40* (2013.01)

(58) Field of Classification Search
CPC ........ G01C 19/34; G01C 19/36; G01C 19/38; G01C 17/38; G01C 17/38

USPC .............................................. 702/92–95, 145
See application file for complete search history.

(56) References Cited

U.S. PATENT DOCUMENTS 3,840,726 A * 10/1974 Harrison ........................ 701/300
2006/0031014 A1    2/2006 Sato et al.

FOREIGN PATENT DOCUMENTS

| JP | 9-81308 | 3/1997 |
|---|---|---|
| JP | 2003-194574 | 7/2003 |

(Continued)

OTHER PUBLICATIONS

John Vince, Apr. 14, 2008, Geometric Algebra for Computer Graphics, Springer Science & Business Media, pp. 113-114.*

(Continued)

*Primary Examiner* — Gregory J Toatley
*Assistant Examiner* — Michael Dalbo
(74) *Attorney, Agent, or Firm* — Beyer Law Group LLP

(57) ABSTRACT

An X-axis sensor, a Y-axis sensor, and a Z-axis sensor that detect a geomagnetic vector are provided, and the direction of the geomagnetic vector is sought on a spherical coordinate from the detection output of each sensor. A reference axis is determined in the spherical coordinate, a hypothetical central point is sought on the reference axis depending on data of two coordinate detection points, a perpendicular line to a plane that includes vectors from the hypothetical central point to the respective data is sought from the cross product of the vectors, an axis that is parallel to the perpendicular line and passes through an origin is set to be a calculated rotational axis, and movement centered around the calculated rotational axis is specified.

11 Claims, 9 Drawing Sheets

(51) Int. Cl.
*G01V 3/08* (2006.01)
*G01V 3/40* (2006.01)

(56) References Cited

FOREIGN PATENT DOCUMENTS

| JP | 2005-61969 | 3/2005 |
| JP | WO2007/099599 | 9/2007 |
| JP | 2008-224642 | 9/2008 |
| JP | 2008-298700 | 12/2008 |
| WO | 2006/009247 | 1/2006 |
| WO | WO 2007/099599 | 9/2007 |
| WO | WO 2007099599 A1 * | 9/2007 |

OTHER PUBLICATIONS

Notice of Reasons of Rejection dated Jun. 5, 2012 from Japanese Application No. 2011-532999.
Search Report dated Nov. 16, 2010 from International Application No. PCT/JP2010/066345.

* cited by examiner

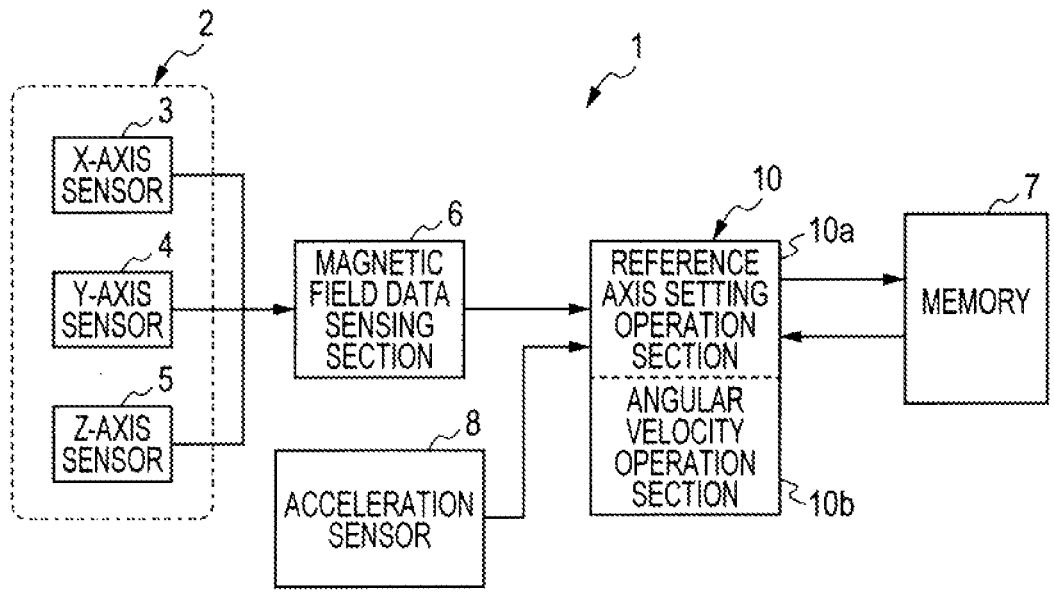
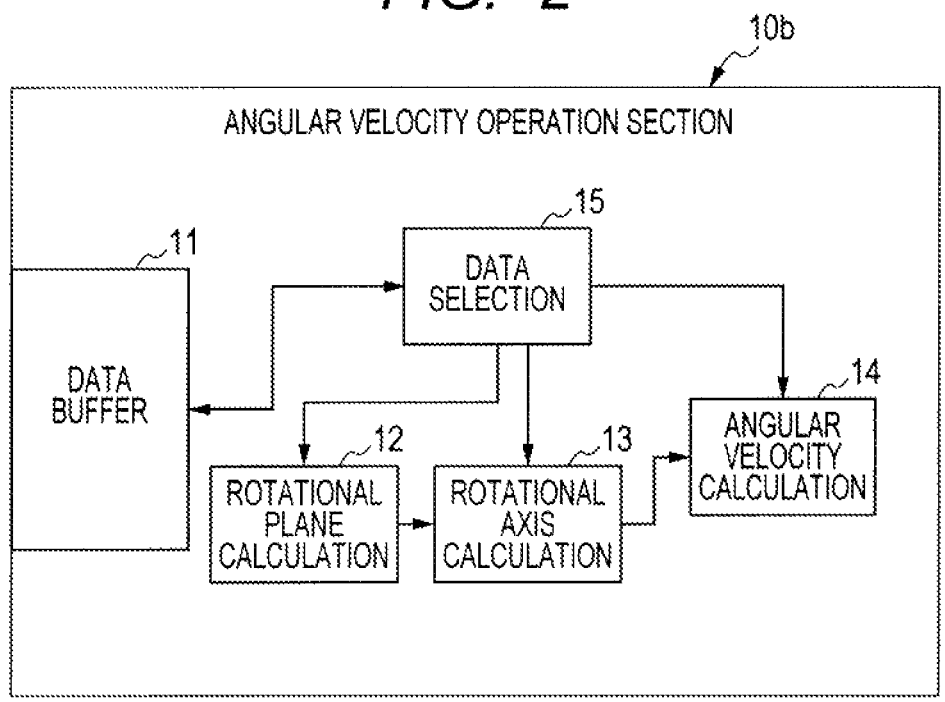

GEOMAGNETISM SENSING DEVICE

CLAIM OF PRIORITY

This application is a Continuation of International Application No. PCT/JP2010/066345 filed on Sep. 22, 2010, which claims benefit of Japanese Patent Application No. 2009-221716 filed on Sep. 26, 2009. The entire contents of each application noted above are hereby incorporated by reference.

BACKGROUND OF THE INVENTION

1. Field of the Invention

The present invention relates to a geomagnetism sensing device that detects geomagnetism by sensors respectively directed in three orthogonal directions and in particular, to a geomagnetism sensing device that can accurately calculate an angular velocity or the like when a magnetism sensing section with sensors mounted therein has turned in a three-dimensional space.

2. Description of the Related Art

A geomagnetism sensing device that detects geomagnetism by using a three-axis magnetic sensor which detects magnetic field strength in three directions which are at right angles to each other has been used as a rotation detection device, a posture sensing device, or the like.

A magnetic gyro described in Japanese Unexamined Patent Application Publication No. 2008-224642 has a three-axis magnetic sensor for detecting geomagnetism, which is disposed on a three-axis orthogonal coordinate. When the magnetic gyro is rotated in a three-dimensional space, a difference vector between two different points of time is sought using output data of three axes and whether or not the difference vector becomes smaller than a predetermined threshold is determined, whereby around what axis among the three axes the rotation has been made is specified.

When the magnetic gyro described in Japanese Unexamined Patent Application Publication No. 2008-224642 is rotated around any axis of three axes, which have been determined by the direction of the magnetic sensor, it is possible to detect a rotational state. However, when the magnetic gyro is rotated around an axis other than the three axes, a rotational axis cannot be recognized, such that in what rotational plane the rotation has been made cannot be specified. That is, only by a single magnetic gyro described in Japanese Unexamined Patent Application Publication No. 2008-224642, it is difficult to detect an angular velocity when rotation has been made around an arbitrary axis in a three-dimensional space.

A magnetic gyro described in PCT Japanese Translation Patent Re-Publication WO2007/099599 is provided with a memory that accumulates data of magnetic vectors which are detected in a time-series manner by a three-axis magnetic sensor, and a rotational axis is calculated on the basis of the data of the magnetic vectors at three or more different points of time accumulated in the memory and also a rotational velocity centered around the calculated rotational axis is calculated.

However, in the magnetic gyro described in PCT Japanese Translation Patent Re-Publication WO2007/099599, since the data of the magnetic vectors at three or more points of time are obtained in a state where there is no standard in a space, if an offset component is superimposed on the data or a noise is superimposed on the data, it is not possible to correct variations in individual data, such that it becomes difficult to specify an accurate rotational axis.

SUMMARY OF THE INVENTION

The present invention provides a geomagnetism sensing device which detects geomagnetism by sensors that are directed in the directions of three orthogonal axes and in which by providing the standard of an operation, a rotational axis can be accurately specified, so that rotational movement centered around the rotational axis can be accurately specified.

According to a first aspect of the invention, there is provided a geomagnetism sensing device including: a magnetism sensing section which includes an X-axis sensor, a Y-axis sensor, and a Z-axis sensor that are directed in the directions of an X axis, a Y axis, and a Z axis that are at right angles to each other, and which can freely turn in three-dimensional directions while maintaining an orthogonal relationship of the X-axis sensor, the Y-axis sensor, and the Z-axis sensor; and an operation section, wherein in the operation section, a reference axis which is located in three-dimensional coordinates of X, Y, and Z is determined and coordinate detection points of a geomagnetic vector are calculated on the three-dimensional coordinates on the basis of detection outputs of the X-axis sensor, the Y-axis sensor, and the Z-axis sensor, and when the magnetism sensing section has rotated, one of two points obtained by projecting at least two coordinate detection points onto the reference axis or an arbitrary point between the two points is set to be a hypothetical central point on the reference axis, a calculated rotational axis is sought from an axis perpendicular to a plane which includes the two coordinate detection points and the hypothetical central point, and the coordinate detection points, and circular movement around the calculated rotational axis is specified.

In the geomagnetism sensing device according to the above aspect of the invention, since the reference axis is determined in advance and the calculated rotational axis is sought by specifying a plane from the reference axis and at least two coordinate detection points, for example, even in a case where the direction of an actual rotational axis gradually changes, rotational axes at the respective times can be relatively accurately specified, so that a disadvantage such as a rotational axis extremely different from the actual being calculated can be prevented.

In the above aspect of the invention, an angular velocity may be calculated from an open angle of the two coordinate detection points with respect to the calculated rotational axis and times when the two coordinate detection points are obtained.

In the above aspect of the invention, it is possible to detect the rotational state of the magnetism sensing section by specifying the rotational axis from at least two coordinate detection points. An angular velocity can be calculated using the data. Of course, a rotational angle may also be calculated and an angular acceleration may also be calculated.

In the above aspect of the invention, it is preferable to set a middle point between two points projected onto the reference axis to be the hypothetical central point.

The hypothetical central point is set on the reference axis on the basis of two coordinate detection points. However, as described above, a plane approximating an actual rotational plane can be specified by setting the middle point between two projected points on the reference axis to be the hypothetical central point.

In the above aspect of the invention, it is preferable to seek a normal to the plane by calculating the cross product of vectors extending from the hypothetical central point to at least two coordinate detection points and set an axis that is parallel to the normal and passes through the origin of the three-dimensional coordinates to be the calculated rotational axis.

However, the plane or the normal may also be sought by a least-square method or other geometric calculations.

According to a second aspect of the invention, there is provided a geomagnetism sensing device including: a magnetism sensing section which includes an X-axis sensor, a Y-axis sensor, and a Z-axis sensor that are directed in the directions of an X axis, a Y axis, and a Z axis that are at right angles to each other, and which can freely turn in three-dimensional directions while maintaining an orthogonal relationship of the X-axis sensor, the Y-axis sensor, and the Z-axis sensor; and an operation section, wherein in the operation section, a reference axis which is located in three-dimensional coordinates of X, Y, and Z is determined and coordinate detection points of a geomagnetic vector are calculated on the three-dimensional coordinates on the basis of detection outputs of the X-axis sensor, the Y-axis sensor, and the Z-axis sensor, and when the magnetism sensing section has rotated, a hypothetical plane which includes at least three coordinate detection points is sought, an intersection point of the hypothetical plane with the reference axis is set to be a hypothetical central point, a normal to the hypothetical plane is calculated from at least two coordinate detection points and the hypothetical central point, a calculated rotational axis is sought from the normal and the coordinate detection points, and circular movement around the calculated rotational axis is specified.

In the geomagnetism sensing device according to the above aspect of the invention, the hypothetical plane is sought from a plurality of coordinate detection points, an intersection point of the hypothetical plane with the reference axis is set to be the hypothetical central point, and the calculated rotational axis is sought by an operation using the hypothetical central point. Geometrically, it is possible to specify the plane and the rotational center only by at least three coordinate detection points. However, a noise is prone to be superimposed on the coordinate detection point where a geomagnetic vector is detected, and in a case where the radius of a rotational locus is short, the absolute value of a vector that is used in an operation becomes small, such that it is difficult to accurately calculate a plane close to an actual rotational plane.

In contrast, in the above aspect of the invention, since the plane and the normal are calculated using vectors from the hypothetical central point on the reference axis to the coordinate detection points, the ratio of a noise can be reduced, and even if the radius of a rotational locus is short, since an operation of the cross product or the like can be carried out by long vectors, it is possible to accurately specify the plane and the normal.

In the above aspect of the invention, it is preferable to seek a normal to the hypothetical plane by calculating the cross product of vectors extending from the hypothetical central point to at least two coordinate detection points.

In this case as well, it is preferable to set an axis that is parallel to the normal and passes through the origin of the three-dimensional coordinates to be the calculated rotational axis.

Further in the second aspect of the invention, an angular velocity may be calculated from an open angle of the two coordinate detection points with respect to the calculated rotational axis and times when the two coordinate positions are obtained.

Further, in the second aspect of the invention, it is preferable that a storage section which retains data in order of a plurality of coordinate detection points be provided, data at the point of time backwards by a predetermined time from latest retained data be set to be reference data, the calculated rotational axis be sought from data obtained at a time later than the reference data, and an angular velocity be calculated from the reference data and the previous data, later data, or previous and later data.

As described above, by using data later in time series than data that becomes a standard for calculation of an angular velocity, the plane and the normal can be calculated from a sufficient amount of data, such that it is possible to improve the degree of precision to specify the plane or the normal.

In the above aspect of the invention, it is preferable that an acceleration sensor which detects acceleration in three-dimensional directions be provided and that when the magnetism sensing section has stopped for a given length of time, the direction of acceleration of the force of gravity be detected by the acceleration sensor and the reference axis be determined with the direction as a standard.

However, in a case where the device is a device which rotates around a predetermined axis, the reference axis may also be fixedly set in advance without using an acceleration sensor.

According to the invention, when complicated movement in which a rotational axis changes at any time has been performed, by using the X-axis sensor, the Y-axis sensor, and the Z-axis sensor which are directed in the directions of three orthogonal axes, it is possible to specify a central axis of rotation with relatively high precision at each point of time with a geomagnetic vector as a standard. As a result, it is possible to accurately seek an angular velocity or the like.

BRIEF DESCRIPTION OF THE DRAWINGS

FIG. 1 is a circuit block diagram of a geomagnetism sensing device related to an embodiment of the invention;

FIG. 2 is a block diagram describing the function of an angular velocity operation section provided in the geomagnetism sensing device shown in FIG. 1;

DESCRIPTION OF THE PREFERRED EMBODIMENTS

Figure 4:
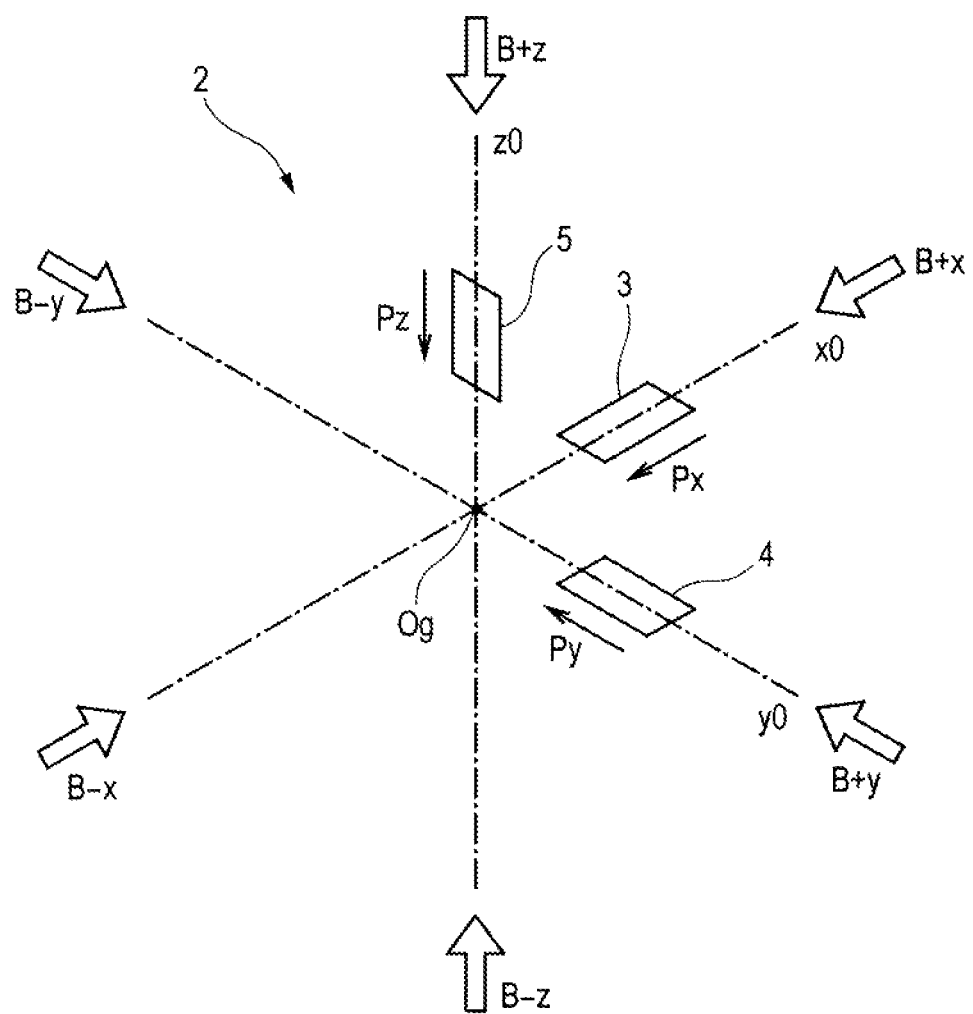
FIG. 4 is an explanatory diagram of an X-axis sensor, a Y-axis sensor, and a Z-axis sensor which are provided in a geomagnetism sensing section.

A geomagnetism sensing device 1 related to an embodiment of the invention shown in FIG. 1 includes a magnetism sensing section 2. As shown in FIG. 4, in the magnetism sensing section 2, an x0 axis, a y0 axis, and a z0 axis which are at right angles to each other are determined. The point of intersection of the x0 axis, the y0 axis, and the z0 axis is an origin Og.

In the magnetism sensing section 2, an X-axis sensor 3, a Y-axis sensor 4, and a Z-axis sensor 5 are mounted. As shown in FIG. 4, the X-axis sensor 3 is fixed along the x0 axis, the Y-axis sensor 4 is fixed along the y0 axis, and the Z-axis sensor is fixed along the z0 axis.

Each of the X-axis sensor 3, the Y-axis sensor 4, and the Z-axis sensor 5 is constituted by a GMR element. The GMR element has a fixed magnetic layer and a free magnetic layer which are formed of a soft magnetic material formed of Ni—Co alloy or Ni—Fe alloy, and a nonmagnetic conductive layer such as copper sandwiched between the fixed magnetic layer and the free magnetic layer. An antiferromagnetic layer is laminated below the fixed magnetic layer and magnetization of the fixed magnetic layer is fixed by antiferromagnetic coupling of the antiferromagnetic layer and the fixed magnetic layer.

As shown in FIG. 4, the X-axis sensor 3 is for sensing a magnetic-field component Bx which is directed in the X direction of geomagnetism and can detect a magnetic-field component B+x in the positive direction in the X direction and a magnetic-field component B−x in the negative direction in the X direction.

The X-axis sensor 3 is fixed in a Px direction in which the direction of the magnetization of the fixed magnetic layer is a direction following an X axis. Magnetization of the free magnetic layer varies in accordance with the direction and the magnitude of the geomagnetism. If the direction of the magnetization of the free magnetic layer becomes parallel to the Px direction that is the direction of the fixed magnetization of the fixed magnetic layer, the resistance value of the X-axis sensor 3 becomes the minimum, and if the direction of the magnetization of the free magnetic layer becomes the opposite direction to the Px direction, the resistance value of the X-axis sensor 3 becomes the maximum. Further, if the direction of the free magnetic layer is perpendicular to the Px direction, the resistance value becomes the average value of the maximum value and the minimum value.

In a magnetic field data sensing section 6 shown in FIG. 1, the X-axis sensor 3 and a fixed resistance are connected in series, and voltage is applied to a series circuit of the X-axis sensor 3 and the fixed resistance, so that a midpoint voltage between the X-axis sensor 3 and the fixed resistance is extracted as a detection output of the X axis. When a magnetic-field component that is directed in the X direction is not imparted to the X-axis sensor 3 or when a magnetic field perpendicular to Px is imparted to the X-axis sensor 3, the detection output of the X axis becomes an origin.

If the whole of the magnetism sensing section 2 is tilted, thereby making the x0 axis shown in FIG. 4 correspond with a geomagnetic vector and making the fixed direction Px of the magnetization of the fixed magnetic layer of the X-axis sensor 3 be the same direction as the geomagnetic vector, the magnetic-field component B+x which is imparted to the X-axis sensor 3 becomes the maximum. The detection output of the X axis at this time becomes the maximum value on the positive side with respect to the origin. Conversely, if the x0 axis shown in FIG. 4 corresponds with the geomagnetic vector and the fixed direction Px of the magnetization of the fixed magnetic layer of the X-axis sensor 3 turns to the opposite to the geomagnetic vector, the magnetic-field component B−x which is imparted to the X-axis sensor 3 becomes the maximum. The detection output of the X axis at this time becomes the maximum value on the negative side with respect to the origin.

Similarly, when a magnetic-field component By in a Py direction is not imparted to the Y-axis sensor 4 or when a magnetic field perpendicular to the Py direction is imparted to the Y-axis sensor 4, a detection output of a Y axis which is output from the magnetic field data sensing section 6 becomes the origin. If the y0 axis is made to correspond with the geomagnetic vector and the direction of the geomagnetic vector is made to correspond with a fixed direction Py of the magnetization of the fixed magnetic layer, a magnetic-field component B+y which is imparted to the Y-axis sensor 4 becomes the maximum and the detection output of the Y axis becomes the maximum value on the positive side with respect to the origin. If the direction of the geomagnetic vector is made to be the opposite direction to the fixed direction Py, a magnetic-field component B−y which is imparted to the Y-axis sensor 4 becomes the maximum and the detection output of the Y axis becomes the maximum value on the negative side with respect to the origin.

Further, when a magnetic-field component Bz in a Pz direction is not imparted to the Z-axis sensor 5 or when a magnetic field perpendicular to the Pz direction is imparted to the Z-axis sensor 5, a detection output of a Z axis which is output from the magnetic field data sensing section 6 becomes the origin. If the z0 axis is made to correspond with the geomagnetic vector and the direction of the geomagnetic vector is made to correspond with a fixed direction Pz of the magnetization of the fixed magnetic layer, a magnetic-field component B+z which is imparted to the Z-axis sensor 5 becomes the maximum and the detection output of the Z axis becomes the maximum value on the positive side with respect to the origin. If the direction of the geomagnetic vector is made to be the opposite direction to the fixed direction Pz, a magnetic-field component B−z which is imparted to the Z-axis sensor 5 becomes the maximum and the detection output of the Z axis becomes the maximum value on the negative side with respect to the origin.

In the X-axis sensor 3, the Y-axis sensor 4, and the Z-axis sensor 5, the absolute value of the maximum value of the detection output on the positive side and the absolute value of the detection output on the negative side are the same.

In addition, as the X-axis sensor 3, provided that the detection output on the positive side is obtained by the magnetic-field component B+x, the detection output on the negative side is obtained by the magnetic-field component B−x, and the maximum value of the detection output on the positive side and the maximum value of the detection output on the negative side have the same absolute value, it can be constituted by a magnetic sensor other than the GMR element. For example, the combination of a Hall element or a MR element which can detect only magnetic field strength on the positive side along the x0 axis and a Hall element or a MR element which can detect only magnetic field strength on the negative side may also be used as the X-axis sensor 3. This is also the same in the Y-axis sensor 4 and the Z-axis sensor 5.

As shown in FIG. 1, the detection outputs of the X axis, the Y axis, and the Z axis detected in the magnetic field data sensing section 6 are imparted to an operation section 10. The operation section 10 is constituted by an A/D conversion section, a CPU, a clock circuit, and the like. The detection outputs of the X axis, the Y axis, and the Z axis detected in the magnetic field data sensing section 6 are intermittently read out to the operation section 10 in short cycles depending on a measurement time of the clock circuit of the operation section 10, and the respective detection outputs are converted into digital values by the A/D conversion section provided in the operation section.

The operation section 10 functions as a reference axis setting operation section 10a and an angular velocity operation section 10b. Both the operation sections are executed by programmed software.

To the CPU constituting the operation section 10, a memory 7 is connected. In the memory 7, software which carries out the processing of each of the reference axis setting operation section 10a and the angular velocity operation section 10b is programmed and stored.

As shown in FIG. 2, in the angular velocity operation section 10b, the processing of plural steps is carried out by software. If the detection output of the X axis, the detection output of the Y axis, and the detection output of the Z axis are intermittently read out from the magnetic field data sensing section 6 in short cycles in synchronization with the clock circuit, these detection outputs are converted into digital data in the A/D conversion section. Further, the detection output of the X axis, the detection output of the Y axis, and the detection output of the Z axis intermittently read out are converted into data of coordinate detection points of a geomagnetic vector Bg on a polar coordinate shown in FIG. 5, by arithmetic processing in the operation section 10, and then stored in a data buffer (a buffer memory) 11 shown in FIG. 3A.

Figure 3A:
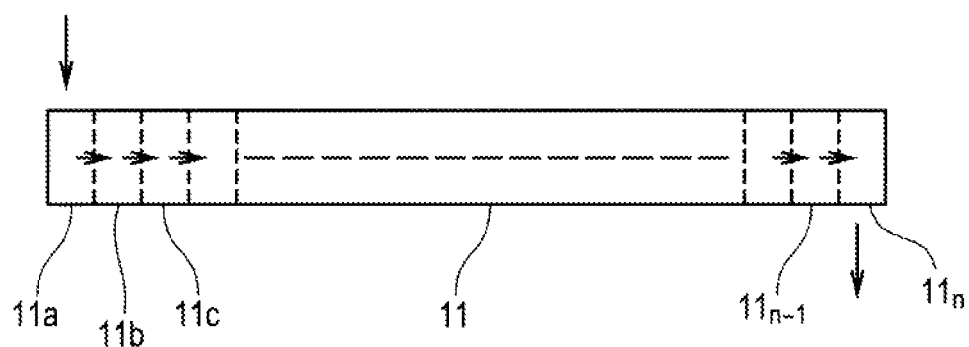
FIGS. 3A and 3B are explanatory diagrams illustrating a processing operation of a data buffer.

The data of the coordinate detection point read out and calculated in short cycles in synchronization with the clock circuit is imparted to a storage section 11a of the data buffer 11 shown in FIG. 3A. Every time the data is imparted to the storage section 11a, the data is sent in order from the storage section 11a up to a storage section 11n and the data in the storage section 11n of the final stage is discarded. During an operation of the geomagnetism sensing device 1, the latest data continues to be read out from the magnetic field data sensing section 6 and is stored in order in the data buffer 11.

Data selection processing 15 of the angular velocity operation section 10b shown in FIG. 2 reads out data required for operation among a plurality of data representing the coordinate detection points of the geomagnetic vector Bg, which is stored in the storage sections 11a to 11n of the data buffer 11. The read-out data is imparted to rotational plane calculation processing 12 and rotational axis calculation processing 13. The calculation results in the rotational plane calculation processing 12 and the rotational axis calculation processing 13 are sent to angular velocity calculation processing 14 and the angular velocity of the moment is continuously calculated.

As shown in FIG. 1, in the geomagnetism sensing device 1, an acceleration sensor 8 is provided. The acceleration sensor 8 has an X sensor which detects acceleration in the direction of the x0 axis, a Y sensor which detects acceleration in the direction of the y0 axis, and a Z sensor which detects acceleration in the direction of the z0 axis. Detection outputs from the respective sensors are imparted to the reference axis setting operation section 10a in the operation section 10.

In the reference axis setting operation section 10a, a reference axis of the geomagnetism sensing device 1 is determined from the information on the acceleration which is obtained from each sensor of the acceleration sensor 8. A method of setting the reference axis is determined by a program depending on the use of the geomagnetism sensing device 1.

For example, when a person holds portable equipment with the geomagnetism sensing device 1 mounted therein and then performs a swing of a baseball bat, a golf club, a tennis racket, or the like, thereby executing a program diagnosing the rotation of the body at the time, the direction of acceleration of the force of gravity detected in the acceleration sensor 8 is set as the reference axis. Further, when acquiring data for correcting hand shake of a camera in which the geomagnetism sensing device 1 is mounted, the reference axis is set in a direction perpendicular to the direction of the acceleration of the force of gravity detected in the acceleration sensor 8.

In a case where the setting of the reference axis is performed in a program diagnosing the rotation of the body, when it has been determined that a person who has held the portable equipment with the geomagnetism sensing device 1 mounted therein in a random direction has stopped for a predetermined time, that is, when it has been determined that for a predetermined time after the starting of the program, a change in the detection output of the magnetism sensing section 2 has not exceeded a threshold and a change in the detection output of the acceleration sensor 8 has not exceeded a threshold, the direction of the acceleration of the force of gravity which is detected in the acceleration sensor 8 is set as the reference axis.

Since the portable equipment is held in a random direction, the reference axis occasionally corresponds with any one of the x0 axis, the y0 axis, and the z0 axis which are set in the geomagnetism sensing device 1 and is occasionally determined in a direction entirely different from each of these axes.

In a case where the geomagnetism sensing device 1 is mounted in a camera, when it has been determined that the camera has stopped, the direction of the acceleration of the force of gravity is detected from the acceleration sensor 8 and the reference axis is determined in a direction perpendicular to the direction of the acceleration of the force of gravity.

In addition, in the case of equipment in which a position at the time of use has been almost determined, like a camera or the like which is used in a stationary position, it is also acceptable that the acceleration sensor 8 is not provided and the direction of the optical axis of a lens is preset as a fixed value of the reference axis in the inside of a camera.

Figure 5:
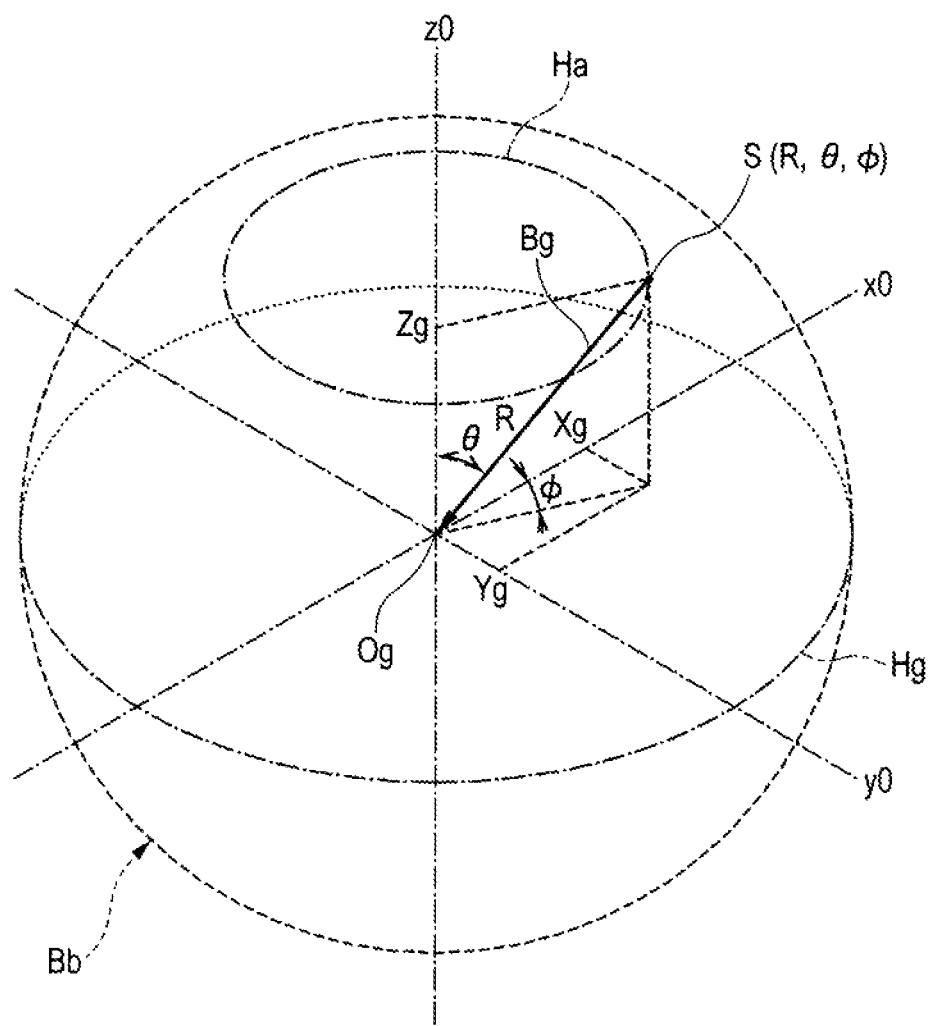
FIG. 5 is an explanatory diagram of a three-dimensional polar coordinate describing an operation of calculating a geomagnetic vector.

In FIG. 5 or later, a case where detection of the rotation of the body such as diagnosis of a swing of a bat is performed using the portable equipment with the geomagnetism sensing device 1 mounted therein will be described as an example. Further, in FIG. 5 or later, in order to facilitate explanation, it is supposed that the reference axis determined using the acceleration sensor 8 corresponds with the z0 axis in the geomagnetism sensing device 1. However, even in a case where the reference axis does not correspond with the z0 axis, arithmetic processing which is described below is basically the same.

The geomagnetic vector Bg shown in FIG. 5 is sought from a detection output Xg by the X-axis sensor 3, a detection output Yg by the Y-axis sensor 4, and a detection output Zg by the Z-axis sensor 5. In the operation section 10, it is converted into the data of a coordinate detection point $S(R, \theta, \phi)$ representing the position of the geomagnetic vector Bg on a three-dimensional polar coordinate, on the basis of the detection outputs Xg, Yg, and Zg of the X-axis sensor 3, the Y-axis sensor 4, and the Z-axis sensor 5. The conversion processing is carried out by a conversion program stored in the operation section 10.

A parameter $\theta$ which is shown in the three-dimensional polar coordinate of FIG. 5 is a depression angle of the geomagnetic vector Bg with respect to the z0 axis (the reference axis) of the magnetism sensing section 2, and $\phi$ is an azimuth angle of the geomagnetic vector Bg with respect to the x0 axis.

In the X-axis sensor 3 shown in FIG. 4, when the direction Px of the fixed magnetization is directed to geomagnetism, the detection output on the positive side becomes the maximum. However, the absolute value thereof is set to be (R), and the absolute value of the maximum value of the detection output on the negative side when Px is set to be the opposite direction to the geomagnetism is set to be (R). Likewise, if the absolute values of the maximum values of the detection outputs on the pulse side and the absolute values of the maximum values of the detection outputs on the negative side of the Y-axis sensor 4 and the Z-axis sensor 5 are set to be (R) together, as shown in FIG. 5, the absolute value of the geomagnetic vector Bg can be represented by R on the three-dimensional polar coordinate. Then, the coordinate detection point S(R, θ, φ) representing the geomagnetic vector Bg on the three-dimensional polar coordinate can be shown as a point on a spherical coordinate Bb having a radius R.

If the geomagnetism sensing device 1 is rotated around the z0 axis that is the reference axis, the coordinate detection point S revolves around the z0 axis in a circular arc locus Ha parallel to an equator line Hg. However, when a person holds the geomagnetism sensing device 1 and then performs swing of a baseball bat, a golf club, a tennis racket, or the like, thereby executing a program diagnosing the rotation of the body at the time, the coordinate detection point S does not necessarily follow a circular arc locus centered on the z0 axis that is the reference axis.

Therefore, in the following, arithmetic processing of calculating a rotational plane and a rotational axis which change from moment to moment, from the data of a plurality of coordinate detection points S, will be described. The arithmetic processing is carried out as the rotational plane calculation processing 12, the rotational axis calculation processing 13, and the angular velocity calculation processing 14 in the angular velocity operation section 10b shown in FIG. 2.

Figure 6:
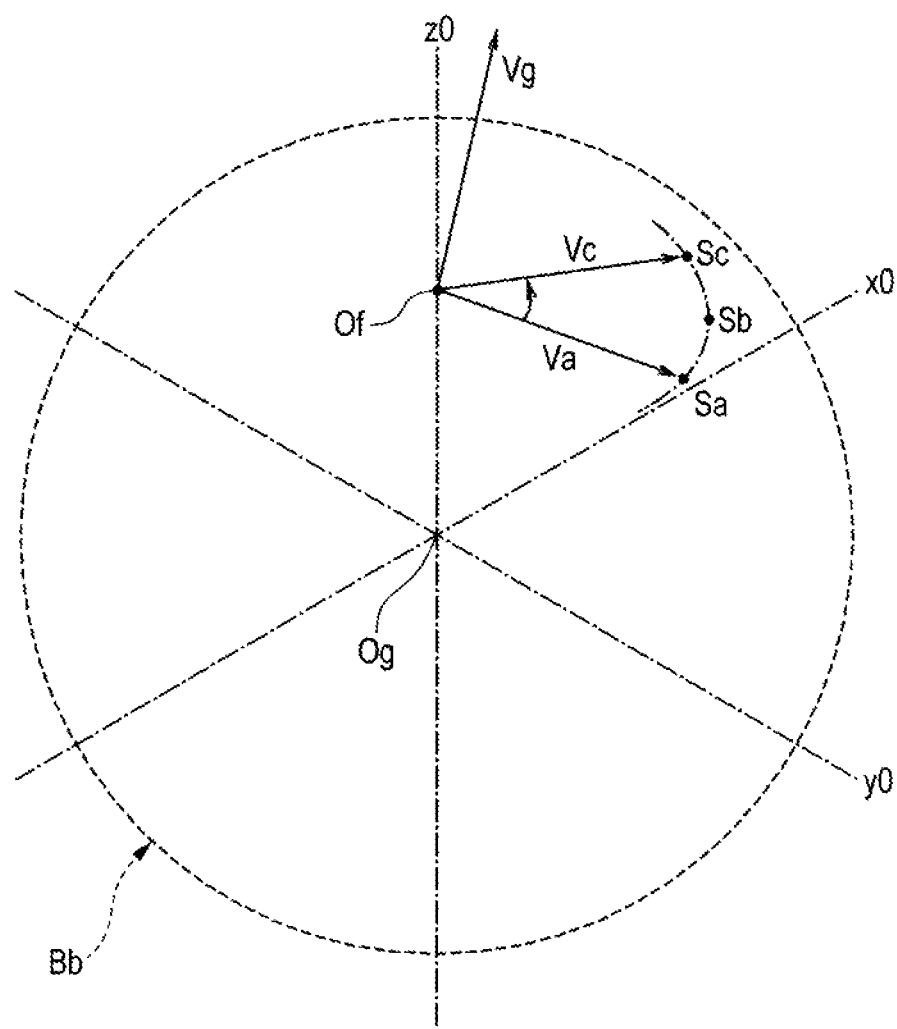
FIG. 6 is an explanatory diagram describing a procedure for calculating a rotational axis related to a first embodiment.

FIG. 6 shows polar coordinate data of the plurality of coordinate detection points S which are stored in the data buffer 11 when the portable equipment with the geomagnetism sensing device 1 mounted therein rotates. During the rotation of the geomagnetism sensing device 1, a large amount of data is present among data Sa and data Sc. However, in FIG. 6, only three sets of data Sa, Sb, and Sc are represented and shown.

In the rotational plane calculation processing 12, two sets of data Sa and Sc among the data of the coordinate detection points S which are stored in the data buffer 11 are extracted and two points obtained by projecting the data Sa and the data Sc onto the z0 axis that is the reference axis are sought. This is the same as seeking two intersection points of perpendicular lines extending from the data Sa and the data Sc to the z0 axis with the z0 axis. A hypothetical central point Of is set on the z0 axis by using the two intersection points. The hypothetical central point Of can be set either by selecting any one of the two intersection points on the z0 axis or by selecting any point between the two intersection points. However, it is preferable to set the middle point between the two intersection points on the z0 axis as the hypothetical central point Of. In addition, as shown in FIG. 5, when the geomagnetism sensing device 1 rotates around the z0 axis that is the reference axis, since the perpendicular lines extending from the two sets of data Sa and Sc to the z0 axis are integrated to a single point, the single point becomes the hypothetical central point Of.

In the rotational plane calculation processing 12, it is supposed that a plane which includes the two sets of data Sa and Sc and the hypothetical central point Of is a plane in which a rotational locus is present, and a perpendicular line Vg perpendicular to the plane is sought. As a method of calculating the perpendicular line Vg, the cross product (Va×Vc) of a vector Va that is directed from the hypothetical central point Of to the data Sa and a vector Vc that is directed from the hypothetical central point Of to the data Sc is sought. The cross product becomes the perpendicular line Vg of the plane which includes the vectors Va and Vc.

In the rotational axis calculation processing 13 of the angular velocity operation section 10b shown in FIG. 2, an axis that passes through the origin Og of the spherical coordinate Bb in parallel with the perpendicular line Vg is sought as a calculated rotational axis Ia. An intersection point of the calculated rotational axis Ia with the plane that includes the vectors Va and Vc is a calculated rotational center Oi, and a distance Ra between the calculated rotational center Oi and the data Sa and a distance Rc between the calculated rotational center Oi and the data Sc become equal to each other (Ra=Rc).

In addition, in the rotational axis calculation processing 13, an axis that passes through an intersection point of a perpendicular bisector of a line segment connecting the data Sa and the data Sb with a perpendicular bisector of a line segment connecting the data Sb and the data Sc and is parallel to the perpendicular line Vg can also be sought as the calculated rotational axis Ia. However, by calculating the cross product of the vectors Va and Vc, setting the calculation result to be the perpendicular line Vg, and setting the axis that passes through the origin of the spherical coordinate Bb in parallel with the Vg to be the calculated rotational axis Ia, it becomes possible to accurately seek the calculated rotational axis Ia in minimal calculation.

By this operation, it is possible to seek a rotational locus Ca that the data Sa, Sb, and Sc follow, and the position or the state of motion of the geomagnetism sensing device 1 can be understood.

Further, in the angular velocity calculation processing 14 of the angular velocity operation section 10b shown in FIG. 2, it is possible to seek an angular velocity of the movement of the geomagnetism sensing device 1 from an open angle of the vector Va and the vector Vc with respect to the calculated rotational center Oi and a temporal difference between a time when the data Sa is obtained and a time when the data Sc is obtained.

The above operation method is effective in an operation in a case where there is the premise that a rotational axis when the geomagnetism sensing device 1 moves is equal to the direction of a predetermined reference axis or does not greatly tilt from the reference axis, and by performing calculation with the reference axis as a standard, it is possible to calculate a rotational axis at each time during movement with high precision. As a result, even in complicated movement in which the rotational axis falls at a fast speed, it is possible to relatively accurately carry out an operation and it becomes easy to prevent a calculation result extremely remote from actual movement from being obtained.

Figure 8:
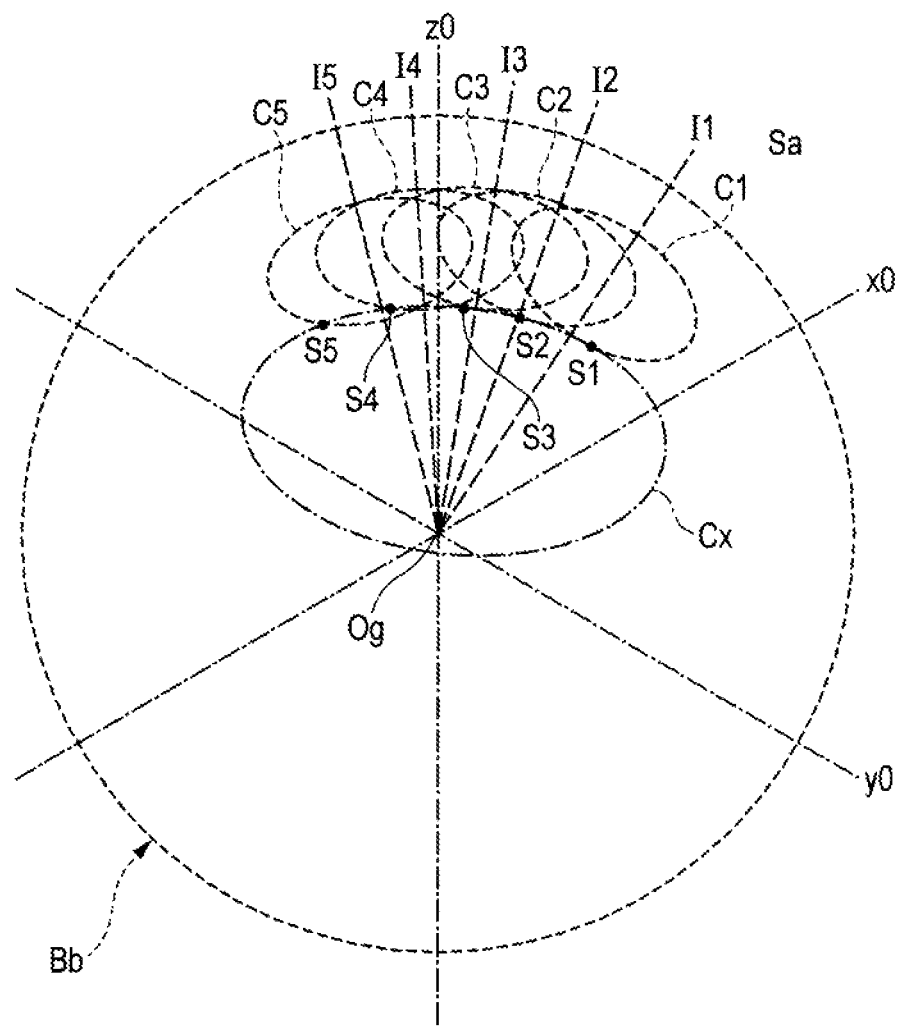
FIG. 8 is an explanatory diagram describing the advantages of the procedure for calculating the rotational axis related to the first embodiment.

FIG. 8 shows detection data when the geomagnetism sensing device 1 continues to rotate and the rotational axis falls at a fast speed. This is generated in a validation program of a swing of a bat, a swing a golf club, a swing of a tennis racket, or the like when quickly rotating the body with a bat or the like held thereon and at the same time, quickly tilting the body.

In FIG. 8, the rotational axis rapidly falls like I1, I2, I3, I4, and I5, so that rotational loci C1 to C5 quickly move until the rotational locus at the time of the rotational axis I1 goes from C1 to the rotational locus C5 at the time of the rotational axis I5. In this case, data appearing on the respective rotational loci sometimes appears on the spherical coordinate Bb in the order of S1, S2, S3, S4, and S5. In fact, a plurality of sets of data is concentrated before and after the respective data S1 to S5, so that many sets of data appear as being arranged in a row which is formed by S1, S2, S3, S4, and S5 shown in FIG. 8.

In this case, if the rotational locus is calculated by selecting at least three points among the data S1 to the data S5, rather than an operation with the reference axis as a standard, a determination is made as if data moved along a rotational locus Cx shown in FIG. 8, such that there is concern that a rotational axis at that time may be greatly deviated from the original rotational axes I1 to I5, thereby being calculated as the center of the rotational locus Cx.

Figure 7:
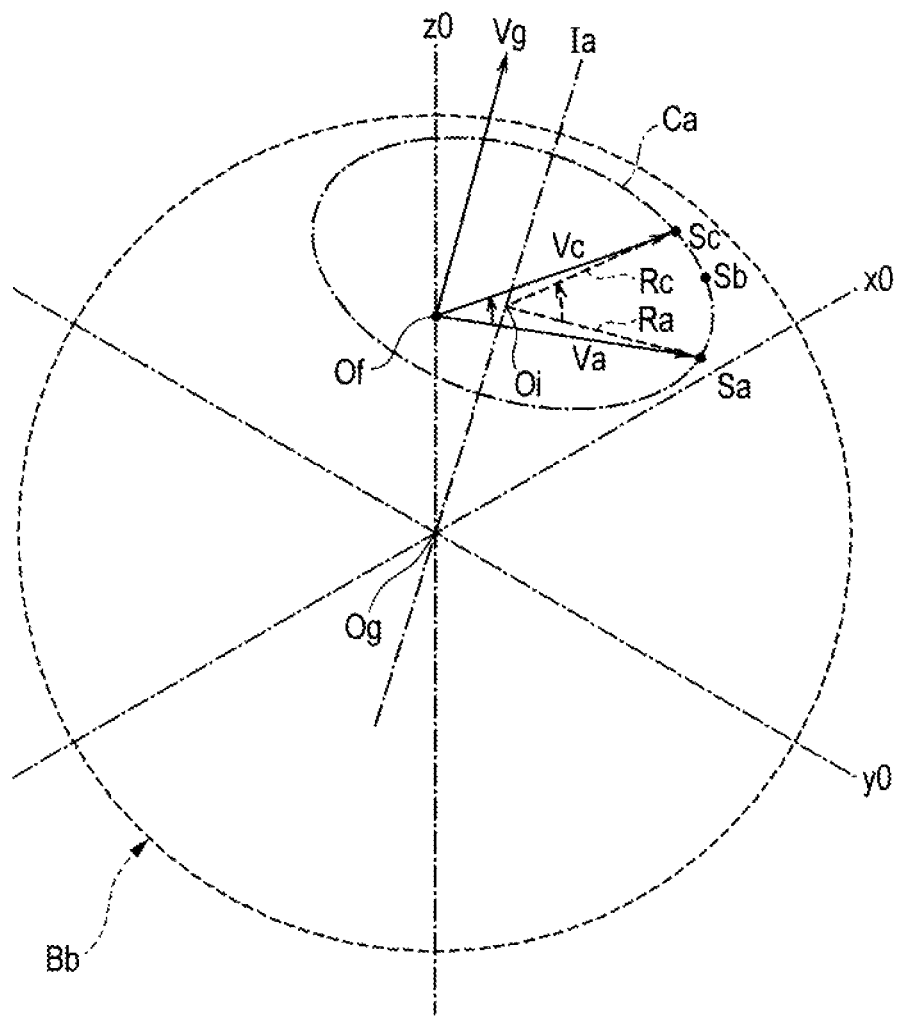
FIG. 7 is an explanatory diagram describing in more detail the procedure for calculating the rotational axis related to the first embodiment.

In contrast to this, as shown in FIGS. 6 and 7, if a plane in which a rotational locus is present and a rotational axis are calculated by determining an axis that is directed in the direction of the force of gravity as a reference axis and setting the hypothetical central point Of on the reference axis, the data S1 to the data S5 can be calculated as being located on the rotational loci C1 to C5 around the rotational axes I1, I2, I3, I4, and I5. Then, it is possible to calculate angular velocities around the rotational axes I1, I2, I3, I4, and I5 at each point of time by using a plurality of data which is present before and after the data S1 to the data S5.

Figure 9:
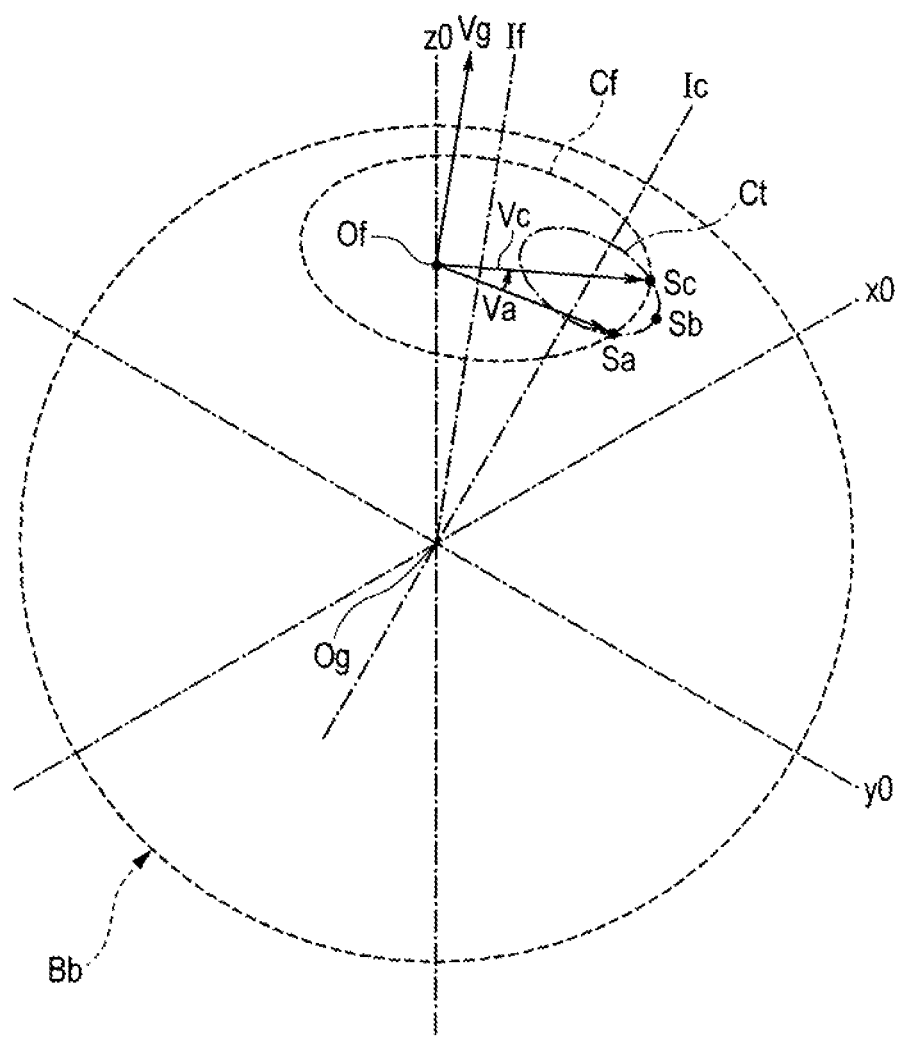
FIG. 9 is an explanatory diagram describing the problem of the procedure for calculating the rotational axis related to the first embodiment.

However, also in the case of carrying out an operation of the rotational axis shown in FIGS. 6 and 7, as shown in FIG. 9, in a case where the radius of a rotational locus Ct of the data Sa, Sb, and Sc of the coordinate detection points is small and the rotational locus Ct is deviated from the z0 axis that is the reference axis, there is the possibility of being unable to accurately specify the rotational locus Ct, thereby being unable to accurately calculate an angular velocity.

In an example shown in FIG. 9, the two sets of data Sa and Sc which are obtained on the rotational locus Ct having a small radius are extracted and an operation is attempted to be carried out in the same way as the operation shown in FIGS. 6 and 7. That is, the hypothetical central point Of is sought on the z0 axis that is the reference axis, the perpendicular line Vg1 is sought by the cross product of the vectors Va and Vc, and an axis that passes through the origin Og of the spherical coordinate Bb in parallel with the perpendicular line Vg1 is set to be a calculated rotational axis If. In this operation, the calculated rotational axis If becomes an axis greatly separated from an actual rotational axis Ic and a calculated rotational locus Cf becomes larger than the actual rotational locus Ct. If an angular velocity is calculated using this operation, the calculated value becomes greatly different from an actual angular velocity.

The operation method shown in FIGS. 6 and 7 becomes effective in the case of premising that the rotational axis of the geomagnetism sensing device 1 does not drastically tilt from the z0 axis that is the reference axis. In fact, when it is used for diagnosis of a swing of a bat, a swing of a golf club, a swing of a tennis racket, or the like, there are few cases where the rotational axis is drastically tilted or the rotational locus becomes extremely small, and the phenomenon shown in FIG. 9 extremely rarely occurs. Accordingly, in the case of actual use, there is hardly a probably.

Figure 10:
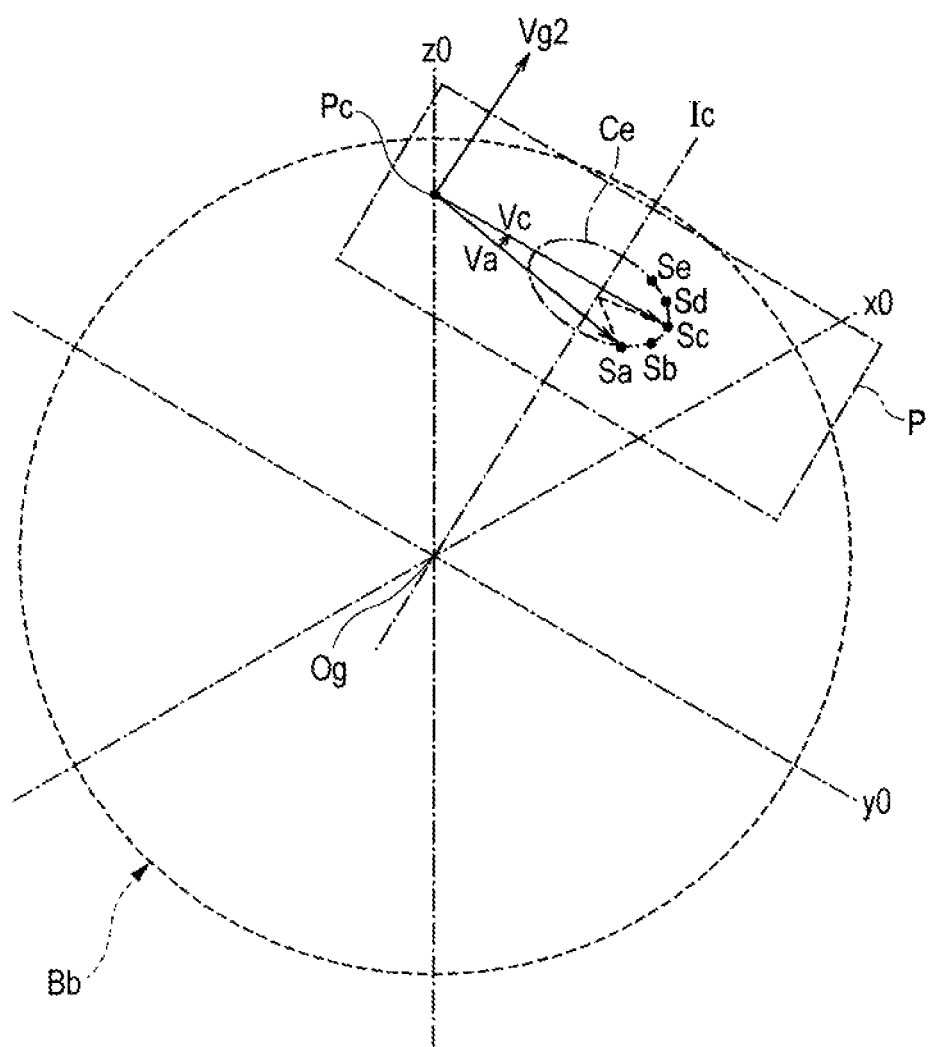
FIG. 10 is an explanatory diagram describing a procedure for calculating the rotational axis related to a second embodiment in which the problem has been overcome.

However, if an operation method related to a second embodiment shown in FIG. 10 is carried out, although the amount of operation increases compared to the operation shown in FIGS. 6 and 7, the degree of precision to calculate the rotational plane and the rotational axis can be further increased, such that even in the phenomenon as shown in FIG. 9, it becomes possible to seek the rotational locus or the rotational axis with high precision.

In the operation method shown in FIG. 10, in the rotational plane calculation processing 12 of the angular velocity operation section 10b shown in FIG. 2, a plurality of sets of data Sa, Sb, Sc, . . . is extracted from the data buffer 11 shown in FIG. 3A, and by using at least three sets of data among this data, a hypothetical plane P in which the three sets of data are present is calculated. The intersection point of the hypothetical plane P with the z0 axis that is the reference axis is set to be a hypothetical central point Pc.

Thereafter, similarly to the operation shown in FIGS. 6 and 7, a perpendicular line Vg2 that passes through the hypothetical central point Pc is sought from the cross product of the vector Va from the hypothetical central point Pc to the data Sa and the vector Vc from the hypothetical central point Pc to the data Sc. An axis which is parallel to the perpendicular line Vg2 and passes through the origin Og of the spherical coordinate Bb is a calculated rotational axis Ic. By seeking a correct calculated rotational axis Ic, it becomes possible to accurately calculate an angular velocity from the data Sa and the data Sc.

In the operation method shown in FIG. 10, by seeking the hypothetical plane P from at least three sets of data, calculation of an incorrect rotational axis, as shown in FIG. 9, can be prevented, so that high-precision operation becomes possible.

In addition, if an operation such as a least-square method is carried out using at least three sets of data among the data Sa, Sb, Sc, Sd, . . . shown in FIG. 10, the rotational locus Ct which includes the data should be able to be calculated. However, since the magnitude of a geomagnetic vector is minute, a noise is prone to be superimposed on data, so that it is difficult to accurately seek the rotational locus Ct having a small radius by an operation, and furthermore, as shown in FIG. 8, in a case where movement in which the rotational axis quickly tilts occurs, it is difficult to accurately specify a small-diameter rotational locus Ct around a changing rotational axis.

In contrast to this, as shown in FIG. 10, by setting the intersection point of the hypothetical plane P with the z0 axis that is the reference axis to be the hypothetical central point Pc, the vectors Va and Vc which are used in calculation can be increased, such that it is possible to obtain the operation result of the cross product without being greatly affected by a noise. Accordingly, the direction of the perpendicular line Vg2 can be accurately specified and the calculation precision of the calculated rotational axis Ic can be increased.

Figure 3B:
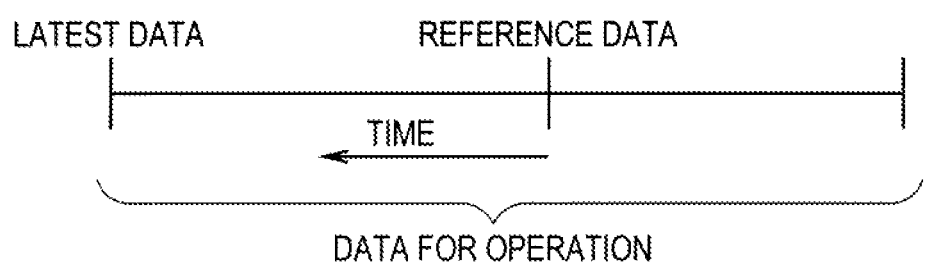

Next, as shown in FIG. 10, in order to calculate an angular velocity by specifying the rotational locus Ct with the data Sa as a standard, it is necessary to seek the hypothetical plane P by using the data Sb, Sc, Sd, . . . which are obtained later than the data Sa in terms of time. Therefore, as shown in FIG. 3B, instead of carrying out an operation only by the latest data among the data which is stored in order in the data buffer 11, the hypothetical plane P shown in FIG. 10 is calculated by setting the data stored at a time backwards by a predetermined time from the latest data to be the reference data (the data Sa in FIG. 10) and using the subsequent data as data for operation (Sb, Sc, Sd, . . . in FIG. 10).

By using a plurality of data obtained and stored later than the reference data in terms of time as the data for operation, as shown in FIG. 8, also with respect to movement in which the rotational axis gradually falls or the rotational direction of a locus greatly changes, it becomes easy to carry out an operation that follows the movement.

It should be understood by those skilled in the art that various modifications, combinations, sub-combinations and alterations may occur depending on design requirements and other factors insofar as they are within the scope of the appended claims of the equivalents thereof.

What is claimed is:

1. A geomagnetism sensing device mounted in an apparatus, the geomagnetism sensing device comprising:
   a magnetism sensing section including an X-axis sensor, a Y-axis sensor, and a Z-axis sensor aligned in directions of an X axis, a Y axis, and a Z axis, respectively, the magnetism sensing section being capable of freely turning in three-dimensional directions while maintaining an orthogonal relationship among the X-axis sensor, the Y-axis sensor, and the Z-axis sensor, the magnetism sensing section providing detection outputs corresponding X, Y, Z components of a geomagnetic vector detected by the X, Y, and Z-axis sensors; and
   an operation section configured to:
      set a reference axis in a three-dimensional coordinate system in accordance with the specific function of the apparatus;
      calculate, after the reference axis is set, a coordinate detection point in the three-dimensional coordinate system corresponding to the geomagnetic vector based on the detection outputs, the coordinate detection point not being located on the reference axis, wherein the magnetism sensing section rotates and a plurality of coordinate detection points are calculated;
      obtain two reference points on the reference axis by projecting two coordinate detection points onto the reference axis;
      obtain a hypothetical central point by selecting one of the two reference points or an arbitrary point on the reference axis between the two reference points;
      obtain a perpendicular line perpendicular to a rotational plane including the two coordinate detection points and the hypothetical central point, the perpendicular line passing through the hypothetical central point and not passing through an origin of the three-dimensional coordinate system;
      obtain a rotational axis which is parallel to the perpendicular line and passes through the origin of the three-dimensional coordinate system; and
      determine a rotational movement of the magnetism sensing section around the rotational axis with respect to the two coordinate detection points,
   whereby the operation section determines at least one of a position, a state of motion, an angular velocity, a rotational angle, and an angular acceleration of the apparatus with an improved accuracy from the rotational movement of the magnetism sensing section around the rotational axis, and
   wherein the apparatus is portable equipment configured to perform a specific function associated with a rotational or positional state thereof, the specific function including correcting hand shakes of the portable equipment in which the geomagnetism sensing device is mounted in accordance with the determined rotational or positional state of the portable equipment.

2. The geomagnetism sensing device according to claim 1, wherein the operation section is configured to calculate the angular velocity from an angle of the two coordinate detection points on the rotational plane with respect to the rotational axis, and a temporal difference between detections of the two coordinate detection points.

3. The geomagnetism sensing device according to claim 1, wherein a middle point between the two reference points is selected as the hypothetical central point.

4. The geomagnetism sensing device according to claim 1, wherein the operation section is further configured to:
   obtain a perpendicular line to the rotational plane by calculating a cross product of vectors extending from the hypothetical central point to the two coordinate detection points; and
   determine an axis that is parallel to the perpendicular line and passes through an origin of the three-dimensional coordinate system as the rotational axis.

5. The geomagnetism sensing device according to claim 1, further comprising:
   an acceleration sensor configured to detect acceleration in three-dimensional directions, the acceleration sensor detecting a direction of gravitational acceleration when the magnetism sensing section is stationary for a given length of time,
   wherein the operation section sets the reference axis based on the direction of gravitational acceleration as a standard direction.

6. The geomagnetism sensing device according to claim 1, wherein the specific function includes providing a diagnosis of a movement of a body holding the apparatus.

7. A geomagnetism sensing device mounted in an apparatus, the geomagnetism sensing device comprising:
   a magnetism sensing section including an X-axis sensor, a Y-axis sensor, and a Z-axis sensor aligned in directions of an X axis, a Y axis, and a Z axis, respectively, the magnetism sensing section being capable of freely turning in three-dimensional directions while maintaining an orthogonal relationship among the X-axis sensor, the Y-axis sensor, and the Z-axis sensor, the magnetism sensing section providing detection outputs corresponding X, Y, Z components of a geomagnetic vector detected by the X, Y, and Z-axis sensors; and
   an operation section configured to:
      set a reference axis in a three-dimensional coordinate system in accordance with the specific function of the apparatus;
      calculate, after the reference axis is set, a coordinate detection point in the three-dimensional coordinate system corresponding to the geomagnetic vector based on the detection outputs, the coordinate detection point not being located on the reference axis, wherein the magnetism sensing section rotates and a plurality of coordinate detection points are calculated;
      obtain a hypothetical plane which includes at least three coordinate detection points;
      determine an intersection point of the hypothetical plane with the reference axis as a hypothetical central point;
      calculate a perpendicular line perpendicular to the hypothetical plane and passing through the hypothetical central point, the perpendicular line not passing through an origin of the three-dimensional coordinate system;
      calculate a rotational axis which is parallel to the perpendicular line and passes through the origin of the three-dimensional coordinate system; and
      determine a rotational movement of the magnetism sensing section around the rotational axis with respect to the at least two coordinate detection points,
   whereby the operation section determines at least one of a position, a state of motion, an angular velocity, a rotational angle, and an angular acceleration of the apparatus with an improved accuracy from the rotational movement of the magnetism sensing section around the rotational axis, wherein the apparatus is portable equipment configured to perform a specific function associated with a rotational or positional state thereof, the specific function including correcting hand shakes of the portable equipment in which the geomagnetism sensing device is mounted in accordance with the determined rotational or positional state of the portable equipment.

8. The geomagnetism sensing device according to claim 7, wherein the operation section calculates the perpendicular line by obtaining the cross product of vectors extending from the hypothetical central point to two of the at least two coordinate detection points.

9. The geomagnetism sensing device according to claim 7, wherein the operation section is further configured to calculate an angular velocity from an angle of the two coordinate detection points with respect to the rotational axis and a temporal difference between detections of the two coordinate detection points.

10. The geomagnetism sensing device according to claim 9, further comprising:
  a storage section configured to retain data of a plurality of coordinate detection points in a order of time at which the data is obtained,
  wherein the rotational axis is calculated using the data obtained later than reference data which was obtained a predetermined time period prior to the latest data,
  and wherein an angular velocity is calculated from the reference data and the data prior to, later than, or prior to and later than the reference data.

11. The geomagnetism sensing device according to claim 7, further comprising:
  an acceleration sensor configured to detect acceleration in three-dimensional directions, the acceleration sensor detecting a direction of gravitational acceleration when the magnetism sensing section is stationary for a given length of time,
  wherein the operation section sets the reference axis based on the direction of gravitational acceleration as a standard direction.

* * * * *